United States Patent
Damitio

(10) Patent No.: US 7,528,661 B2
(45) Date of Patent: May 5, 2009

(54) LOW QUIESCENT CURRENT OUTPUT STAGE AND METHOD WITH IMPROVED OUTPUT DRIVE

(75) Inventor: Paul G. Damitio, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/890,682

(22) Filed: Aug. 7, 2007

(65) Prior Publication Data

US 2009/0039961 A1    Feb. 12, 2009

(51) Int. Cl.
H03F 3/26    (2006.01)

(52) U.S. Cl. .................................................... 330/267

(58) Field of Classification Search ................ 330/267, 330/252–261
See application file for complete search history.

(56) References Cited

U.S. PATENT DOCUMENTS 5,351,012 A * 9/1994 Toumazou ................... 330/264

* cited by examiner

Primary Examiner—Robert Pascal
Assistant Examiner—Khiem D Nguyen
(74) Attorney, Agent, or Firm—John J. Patti; Wade J. Brady, III; Frederick J. Telecky, Jr.

(57) ABSTRACT

Circuitry for increasing the maximum output current magnitude of a diamond buffer (Q57,58,74,75) having increased maximum output current provides a bias current of a first magnitude (I) into an emitter of a PNP first input transistor (Q57) and sinks a bias current of the first magnitude out of an emitter of an NPN second input transistor (Q55). The decrease is sensed in a collector current of the first input transistor caused by a demand for increased base current by a NPN first output transistor (Q74) of the diamond buffer. A collector current (Ic(65)) in an NPN another transistor (Q65) is increased in response to the decrease in the collector current of the first input transistor. The increased collector current in the first transistor is mirrored into a base of the first output transistor to boost its base current and maintain operation of the first input transistor when the amount of base current demanded by the first output transistor exceeds the first magnitude.

15 Claims, 5 Drawing Sheets

US 7,528,661 B2

LOW QUIESCENT CURRENT OUTPUT STAGE AND METHOD WITH IMPROVED OUTPUT DRIVE

BACKGROUND OF THE INVENTION

The present invention relates generally to low-power operational amplifiers which have low quiescent current but nevertheless are capable of delivering large output current, and more particularly to amplifier output stages which have low quiescent current but nevertheless are capable of delivering large output current.

FIG. 1 shows a conventional two-buffer input stage voltage feedback operational amplifier 1A. Two-buffer input stage 1A includes a buffer 2 having an input coupled to Vin⁻ and an output 12A coupled by a transconductance element $Rg_m$ to the output 12B of another buffer amplifier 3. The input of buffer 3 is coupled to Vin⁺. Buffer 2 is powered by supply voltages $V_{CC}$ and $V_{EE}$. Buffer 3 is configured such that a current flowing out of or into its output terminal 12B will be replicated in conductors 5 and 8 and presented to the control inputs of complementary current mirrors 4 and 7. Current mirror 4 is referenced to $V_{CC}$ and current mirror 7 is referenced to $V_{EE}$. The outputs of current mirrors 4 and 7 are connected by conductor 6 to the input of a unity gain buffer 9. Buffer 9 is powered by $V_{CC}$ and $V_{EE}$, and produces an output voltage Vout.

By virtue of buffer amplifiers 2 and 3, a differential input voltage present at inputs Vin⁺ and Vin⁻ is replicated upon the terminals of resistor transconductance element $R_{gm}$. Thus, the transconductance of input stage 1A of FIG. 1 is approximately described by the expression $R_{gm}$=I1/Vin, where Vin=Vin⁺−Vin⁻. Since the small signal bandwidth is equal to $g_m$/Cc and since I1 is replicated by the current mirror and delivered to the compensation capacitor Cc, the large signal bandwidth will be approximately equal to the small signal bandwidth. The output stage of FIG. 1 has the limited output current drive capability of a typical low power bipolar transistor based operational amplifier.

FIG. 2 shows a conventional circuit 30 including a diamond buffer and its associated bias circuitry which together can be used to implement each of buffers 2, 3 and 9 of FIG. 1. The diamond buffer circuitry 30 of FIG. 2 includes diode-connected PNP transistor Q1 having its emitter coupled by resistor R1 to $V_{CC}$, and its base and collector connected to one terminal of a current source 24 producing a current I and to the base of a PNP transistor Q54. The emitter of transistor Q54 is coupled by resistor R39 to $V_{CC}$ and its collector is connected to the base of NPN output transistor Q74 and to the emitter of PNP input transistor Q57. The base of transistor Q57 is connected to an input signal Vin and its collector is connected to $V_{EE}$. Another terminal of current source 24 is connected to the collector and base of NPN transistor Q2 and to the base of PNP transistor Q55. The emitter of transistor Q2 is coupled by resistor R2 to $V_{EE}$, and the emitter of transistor Q55 is coupled by resistor R40 to $V_{EE}$. The collector of transistor Q55 is connected to the base of PNP output transistor Q75 and to the emitter of NPN input transistor Q58, the base of which is coupled to Vin. The emitters of output transistors Q74 and Q75 are connected to an output conductor 25 through which an output current Io flows. If the various NPN and PNP transistors are assumed to have a maximum DC current gain of β, then the equation for the maximum output current of diamond buffer 30 is $Io(\max)=\beta \times I$.

FIG. 3 shows a known output stage 31 which includes the diamond buffer circuitry 30 of FIG. 2 and also includes a "β²" ("Beta squared") circuit 34 which substantially increases the maximum output current that can be supplied by output stage 31. β² circuit 34 includes a current mirror including diode-connected NPN transistor Q71 having its emitter coupled by resistor R50 to $V_{EE}$. Instead of being connected to $V_{EE}$, the collector of diamond buffer output transistor Q75 is instead connected to the base and collector of NPN current mirror input transistor Q71 and to the base of NPN current mirror output transistor Q73, the emitter of which is coupled by resistor R52 to $V_{EE}$. Similarly, instead of being connected to $V_{CC}$, the collector of diamond buffer output transistor Q74 is instead connected to the base and collector of PNP current mirror input transistor Q70 and to the base of PNP current mirror output transistor Q72, the emitter of which is coupled by resistor R51 to $V_{CC}$. The collector of current mirror output transistor Q73 is connected to the base of PNP output transistor Q79 and to the collector of PNP transistor Q76 and the emitter of NPN transistor Q77. Similarly, the collector of current mirror output transistor Q72 is connected to the base of NPN output transistor Q78 and to the emitter of transistor Q76 and the collector of transistor Q77. The bases of transistors Q76 and Q77 are connected together to provide a 2 $V_{BE}$ voltage drop. β² output circuitry 34 is a class AB output circuit that allows the output drivers to be biased using transistors which require only half of the chip area that would be required if NPN and PNP transistors Q77 and Q76 were to be series-connected. A resistor R56 is connected between the output terminal 36 of β² output circuitry 34 and the output terminal 25 of circuit 30. Those skilled in the art will recognize that output stage 31 of FIG. 3, including diamond buffer stage Q57,58,74,75 coupled through resistor R56 to β² output circuitry 34 is a rudimentary unity gain configured current feedback amplifier.

The output stage 31 shown in FIG. 3, assuming the complementary current mirrors have a current gain of 1, is capable of generating an output current as high as I×β², where I is the collector current flowing in transistors Q54 or Q55. Under quiescent conditions, the current $I_n$ flowing in the collectors of transistors Q72 and Q73 will be some multiple of I, depending on the ratio set up between the input and output transistors of the diamond buffer and the input and output transistors of the complementary current mirrors. In this example, the diamond buffer has a ratio of 2 from input to output and the current mirror ratios have a ratio of 1 from input to output. Consequently, the current In will be equal to 2I. As the load on output conductor 36 increases, the current $I_n$ will increase as required by the base of output transistor Q78 or Q79. This occurs via current feedback through resistor R56. Since the current In is also flowing in either the collector of transistor Q74 or Q75, it follows that In can increase until it is β times the maximum current available at the base of transistor Q74 or Q75; that is, the current In can increase until it is equal to β×I. The equation for the output current maximum Io is developed as follows:

$Io(\max)=\beta \times In(\max)$, $In(\max)=\beta \times I$, so $Io(\max)=\beta(\beta \times I)=\beta^2 \times I$.

The circuit 31 of FIG. 3, which is ordinarily used as output stage 9 in the circuit configuration of FIG. 1, has a current feedback based topology, provides β² current gain capability, and also has good stability when biased dynamically. Dynamic bias also provides good slew rate performance.

(Dynamic bias can be implemented by providing additional outputs for the current mirrors, respectively. For example, in FIG. 1, this would be shown as a second output of each of current mirrors 4 and 7. The additional outputs would be used to bias output stage 9. During a slew condition the additional outputs provide additional boost to output stage 9. Even though output stage 31 of FIG. 3 is capable of $\beta^2$ current gain, it may be the case that an operational amplifier such as that depicted in FIG. 1 is required to specify a minimum output current capability which is greater than that able to be provided by the output stage of FIG. 3 with a given quiescent current.)

There is an unmet need for an operational amplifier capable of producing substantially increased output current without requiring substantially increased quiescent current.

There also is an unmet need for an output stage capable of producing substantially increased output current without requiring substantially increased quiescent current.

SUMMARY OF THE INVENTION

It is an object of the present invention to provide an operational amplifier capable of producing substantially increased output current without requiring substantially increased quiescent current.

It is another object of the present invention to provide an amplifier output stage capable of producing substantially increased output current without requiring substantially increased quiescent current.

Briefly described, and in accordance with one embodiment, the present invention provides circuitry for increasing the maximum output current magnitude of a diamond buffer (Q57,58,74,75) having increased maximum output current which provides a bias current of a first magnitude (I) into an emitter of a PNP first input transistor (Q57) and sinks a bias current of the first magnitude out of an emitter of an NPN second input transistor (Q58). The decrease is sensed in a collector current of the first input transistor caused by a demand for increased base current by an NPN first output transistor (Q74) of the diamond buffer. A collector current (Ic(65)) in an NPN another transistor (Q65) is increased in response to the decrease in the collector current of the first input transistor. The increased collector current in the first transistor is mirrored into a base of the first output transistor to boost its base current and maintain operation of the first input transistor when the amount of base current demanded by the first output transistor exceeds the first magnitude.

In one embodiment, the invention provides output stage circuitry (9) including a diamond buffer (Q57,58,74,75) having a PNP first input transistor (Q57), an NPN second input transistor (Q58), an NPN first output transistor (Q74), and a PNP second output transistor (Q75). An emitter of the first input transistor (Q57) is coupled to a first conductor (11A) and receives a first reference current having a first predetermined value (I). An emitter of the second input transistor (Q58) is coupled to a second conductor (11B) and receives a second reference current having the first predetermined value (I). Bases of the first (Q57) and second (Q58) input transistors are coupled to an input conductor (6), bases of the first (Q74) and second (Q75) output transistors are coupled to the first (11A) and second (11B) conductors, respectively, and emitters of the first (Q74) and second (Q75) output transistors are coupled to a first output conductor (25). A linear boost circuit (40) includes a first current mirror (Q66,Q60). A PNP first transistor (Q64) has an emitter coupled to a first sensing resistor (R45). A second current mirror (Q67,Q61) includes an NPN second transistor (Q65) having an emitter coupled to a second sensing resistor (R46). An input (16B) of the first current mirror (Q66,Q60) is coupled to a collector of the second transistor (Q65), an output of the first current mirror (Q66,Q60) is coupled to the first conductor (11A), and an input (16A) of the second current mirror (Q67,Q61) is coupled to a collector of the first transistor (Q64). An output of the second current mirror (Q67,Q61) is coupled to the second conductor (11B) to boost current in the first (Q74) and second (Q75) output transistors when they require base currents greater in magnitude than the first predetermined value (I).

In a described embodiment, an output driver includes a third current mirror (Q70,Q72) having an input (17A) coupled to a collector of the first output transistor (Q74) and an output (18A) coupled to a base of an NPN third output transistor (Q78). A fourth current mirror (Q71,Q73) has an input (17B) coupled to a collector of the second output transistor (Q75) and an output (18B) coupled to a base of a PNP fourth output transistor (Q79). Emitters of the third (Q78) and fourth (Q79) output transistors are coupled by a second output conductor (36) to one terminal of a feedback resistor (R56) having another terminal coupled by the first output conductor (25) to emitters of the first (Q74) and second (Q75) output transistors.

In a described embodiment, a PNP current mirror input transistor (Q1) has a base and collector coupled to one terminal of a current source (24). A PNP current mirror output transistor (Q54) has a collector coupled to the first output conductor (11A) to provide the first reference current, and a base of the first transistor (Q64). An NPN current mirror input transistor (Q2) has a base and collector coupled to another terminal of the current source (24) and to a bases of an NPN current mirror output transistor (Q55) having a collector coupled to the second output conductor (11B) to provide the second reference current and to a base of the second transistor (Q65). An emitter of the PNP current mirror input transistor (Q1) is coupled to a first reference voltage ($V_{CC}$) by means of a first resistor (R1) which establishes the first reference current at the first predetermined value (I) and an emitter of the NPN current mirror input transistor (Q2) is coupled to a second reference voltage ($V_{EE}$) by means of a second resistor (R2) which establishes the second reference current at the first predetermined value (I).

In one embodiment, a first clamp transistor (62) is coupled across the first sensing resistor (R45) to prevent transient overvoltages thereon and a second clamp transistor (Q63) coupled across the second sensing resistor (R46) to prevent transient overvoltages thereon.

In a described embodiment, the base of the PNP current mirror output transistor (Q54) is connected to the base of the PNP current mirror input transistor (Q1), and the base of the NPN current mirror output transistor (Q55) is connected to the base of the NPN current mirror input transistor (Q2), to provide dynamic bias to the output stage circuitry (9).

In one embodiment, the invention provides circuitry (4,7, Q54,Q55) for dynamic biasing of the output stage circuitry including a PNP current mirror output transistor (Q54) and an NPN current mirror output transistor (Q55), wherein the first conductor (11A) is coupled to the PNP current mirror output transistor (Q54) which is controlled in response to an input voltage applied to an input stage (3) of an operational amplifier (1B) and the second conductor (11B) is coupled to the NPN current mirror output transistor (Q55), which also is controlled in response to the input voltage applied to the input stage (3) of the operational amplifier (1B).

In one embodiment, the invention provides a method for increasing the maximum output current magnitude of a diamond buffer (Q57,58,74,75), including sourcing a bias current of a first predetermined magnitude (I) into an emitter of a PNP first input transistor (Q57) of the diamond buffer (Q57,58,74,75) and sinking a bias current of the first predetermined magnitude (I) out of an emitter of an NPN second input transistor (Q58) of the diamond buffer (Q57,58,74,75), sensing a decrease in a collector current of the first input transistor (Q57) caused by a demand for increased base current by an NPN first output transistor (Q74) of the diamond buffer (Q57,58,74,75), increasing a collector current (Ic(65)) in an NPN another transistor (NPN second transistor Q65) in response to the sensed decrease in the collector current of the first input transistor (Q57), and mirroring the increased collector current (Ic(65)) in the second transistor (Q65) into a base of the first output transistor (Q74) to boost the base current thereof and maintain operation of the first input transistor (Q57) without substantially increasing quiescent current of the diamond buffer (Q57,58,74,75) when the amount of base current demanded by the first output transistor (Q74) exceeds the first predetermined magnitude (I). In one embodiment, the method includes the sensing a decrease in a collector current of the second input transistor (Q58) caused by a demand for increased base current by a PNP second output transistor (Q75) of the diamond buffer (Q57,58,74,75), increasing a collector current (Ic(64)) in a PNP another transistor (PNP first transistor Q64) in response to the sensed decrease in the collector current of the second input transistor (Q58), and mirroring the increased collector current (Ic(64)) in the first transistor (Q64) into a base of the second output transistor (Q75) to boost the base current thereof and maintain operation of the second input transistor (Q58) without substantially increasing quiescent current of the diamond buffer (Q57,58,74,75) when the amount of base current demanded by the second output transistor (Q75) exceeds the first predetermined magnitude (I).

In one embodiment, the invention provides circuitry for increasing the maximum output current magnitude of a diamond buffer (Q57,58,74,75), including means for sourcing a bias current of a first predetermined magnitude (I) into an emitter of a PNP first input transistor (Q57) of the diamond buffer (Q57,58,74,75) and sinking a bias current of the first predetermined magnitude (I) out of an emitter of an NPN second input transistor (Q58) of the diamond buffer (Q57,58, 74,75), means for sensing a decrease in a collector current of the first input transistor (Q57) caused by a demand for increased base current by a NPN first output transistor (Q74) of the diamond buffer (Q57,58,74,75), means for increasing a collector current (Ic(65)) in an NPN another transistor (NPN second transistor Q65) in response to the sensed decrease in the collector current of the first input transistor (Q57), and means for mirroring the increased collector current (Ic(65)) in the second transistor (Q65) into a base of the first output transistor (Q74) to boost the base current thereof and maintain operation of the first input transistor (Q57) when the amount of base current demanded by the first output transistor (Q74) exceeds the first predetermined magnitude (I).

DETAILED DESCRIPTION OF THE PREFERRED EMBODIMENTS

Figure 1:
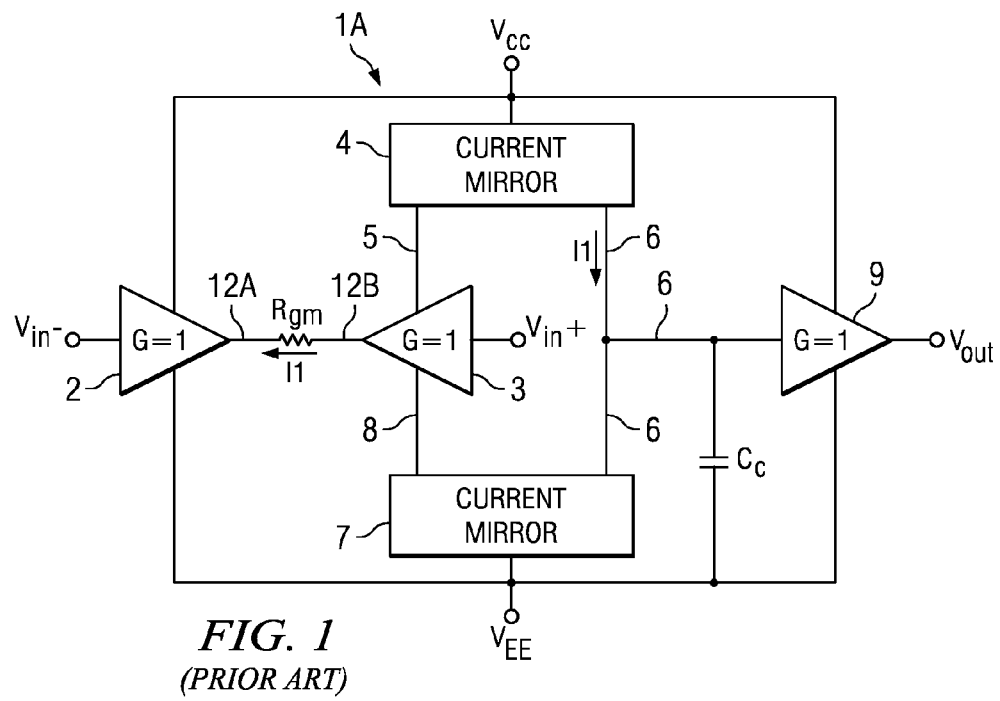
FIG. 1 is a block diagram of a conventional two-buffer voltage feedback operational amplifier.
Figure 2:
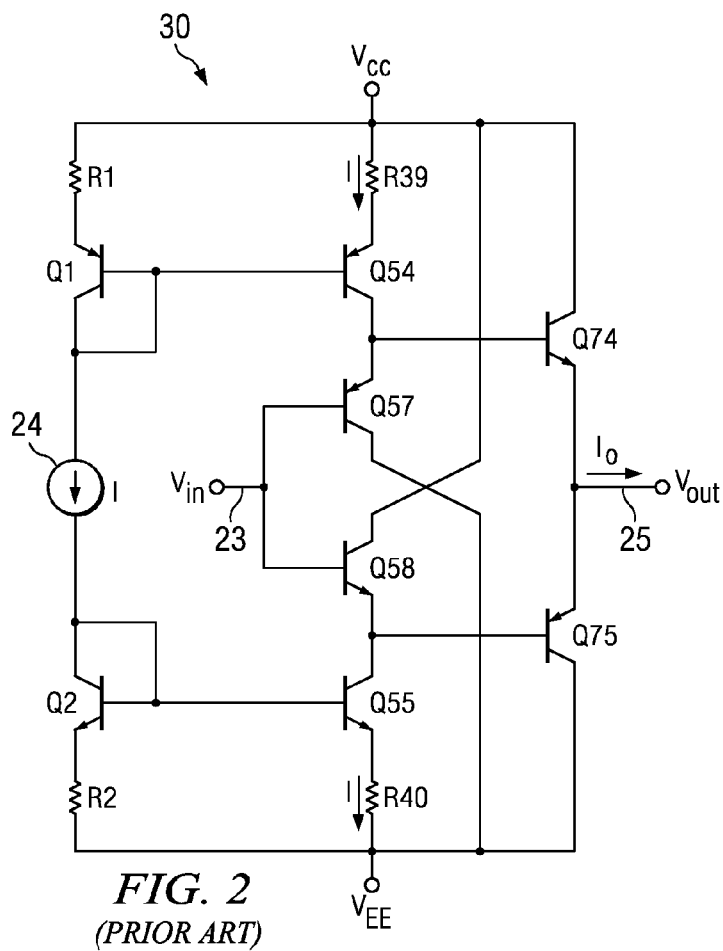
FIG. 2 is a schematic diagram of a conventional diamond buffer circuit.
Figure 3:
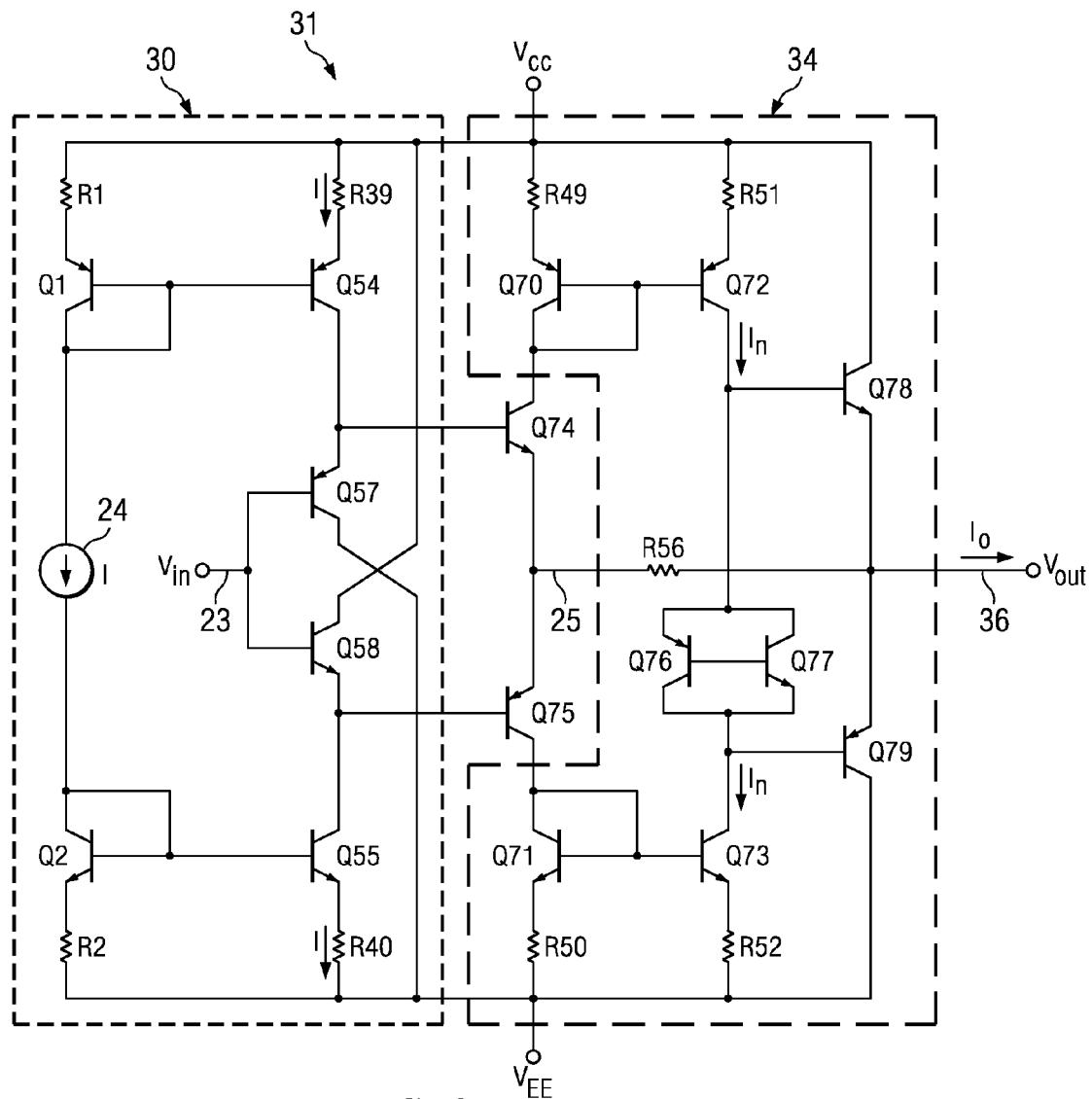
FIG. 3 is a schematic diagram of an output stage including both of the conventional diamond buffer of FIG. 2 and additional circuitry 34 to provide a $\beta^2$ output circuit.
Figure 4:
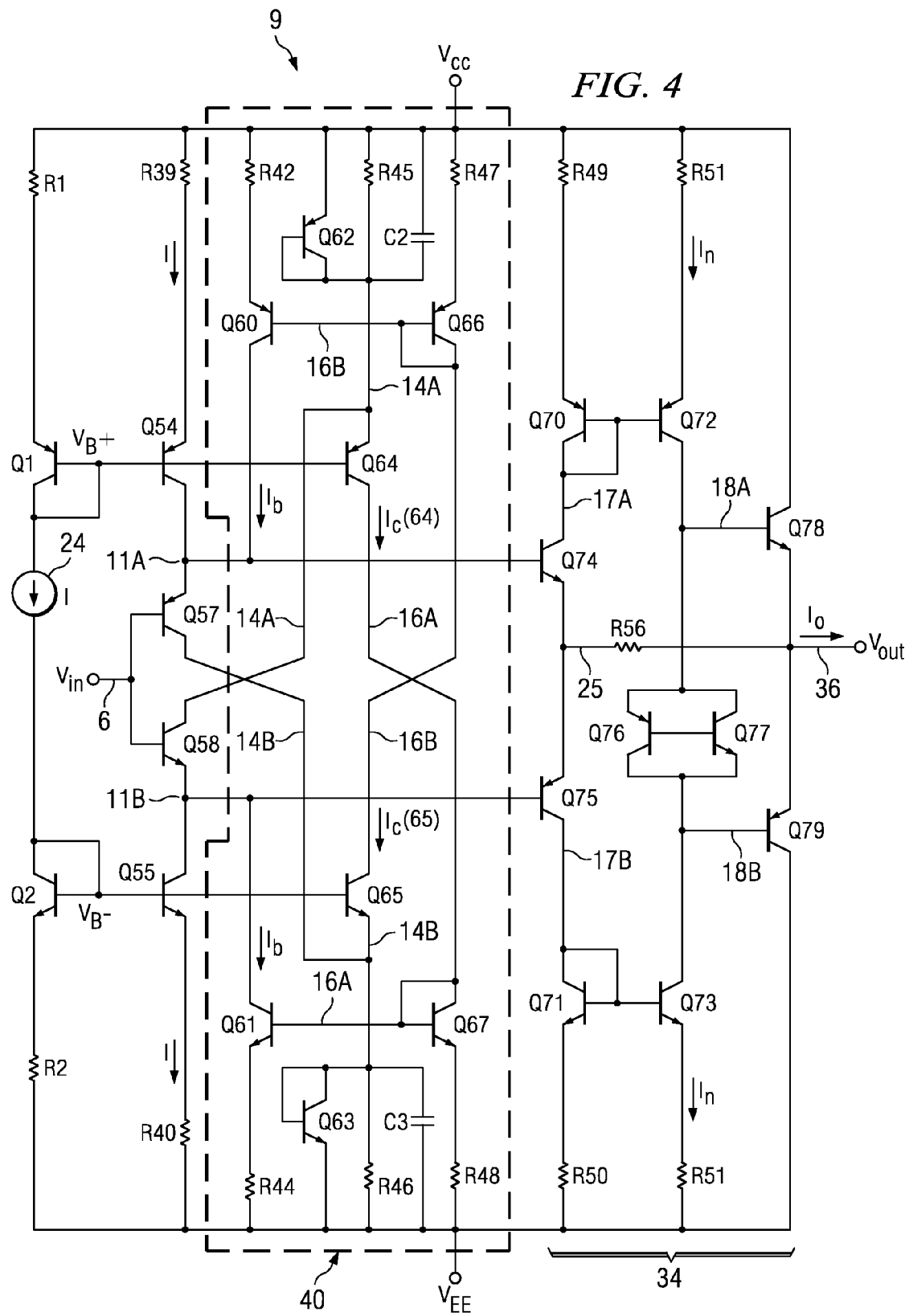
FIG. 4 is a detailed schematic diagram showing an implementation of the output stage 9 in FIG. 1 in accordance with the present invention.

FIG. 4 shows an improved output stage 9, which can be advantageously used as the output stage 9 in the slew rate enhanced voltage feedback operational amplifier 1A of FIG. 1. Output stage 9 in FIG. 4 includes a conventional diamond buffer which includes PNP transistors Q57 and Q75 and NPN transistors Q58 and Q74. Output stage 9 also includes the previously described known current feedback-based circuit topology of FIG. 3 including $\beta^2$ output circuitry 34 including resistor R56, PNP transistors Q70, Q72, Q76 and Q79 and NPN transistors Q78, Q77, Q71 and Q73.

The $\beta 2$ output circuitry includes the two current mirrors Q70,Q72 and Q71,Q73 which are coupled between the collectors of diamond buffer output transistors Q74 and Q75 and the bases of output transistors Q78 and Q79, respectively. From the output conductor 36 there is feedback to the emitters of transistors Q74 and Q75 through resistor R56. As a load demands additional output current, the main output transistors Q78 and Q79 may begin to "run out" of base current. If this happens, a difference voltage is developed across resistor R56. The resulting current flowing through resistor R56 also flows through the emitter of either transistor Q74 or transistor Q75 and is fed back to the base of output transistor Q78 or Q79 such that the needed additional base current is supplied to output transistors Q78 and Q79 by means of associated current mirrors.

In accordance with the present invention, output stage 9 further includes a linear boost circuit 40 which strongly enhances the foregoing operation without substantially increasing the quiescent operating current of output stage 9.

Input conductor 6 is connected to the bases of diamond buffer input transistors Q57 and Q58 to apply Vin thereto. The emitter of transistor Q57 is connected by conductor 11A to the base of diamond buffer output transistor Q74 and the collector of PNP current mirror output transistor Q54, the base of which is connected to the base and collector of PNP current mirror input transistor Q1 that receives a current having the value I from one terminal of a current source 24. (Transistor Q54 could also be coupled to current mirror 4 of FIG. 1 to provide dynamic or feed-forward bias to the output stage 9 in FIG. 1. In this case, transistor Q64 would still be connected to transistor Q1 as shown.) The emitter of transistor Q1 is coupled to $V_{CC}$ by resistor R1, which determines the amount of the current I flowing through resistor R39 and transistor Q54.

Similarly, the emitter of transistor Q58 is connected by conductor 11B to the base of diamond buffer output transistor Q75 and the collector of NPN current mirror output transistor Q55, the base of which is connected to the base and collector of NPN current mirror input transistor Q2 which receives the current I from another terminal of current source 24. (If dynamic bias is used, the previous parenthetical comment applies.) The emitter of transistor Q2 is coupled to $V_{EE}$ by resistor R2, which determines the amount of the current I flowing through resistor R40 and transistor Q55. As subsequently explained, the resistance of reference resistors R1 and R2 can be 4 kilohms.

Linear boost circuit 40 includes PNP transistors Q60, Q62, Q64 and Q66 and also includes NPN transistors Q61, Q63, Q65 and Q67, along with resistors R42, R44, R45, R46, R47 and R48. The emitter of transistor Q62 is connected to $V_{CC}$ and its base and collector are connected to one terminal of resistor R45 and to the emitter of transistor Q64 and also to the collector of input transistor Q58 by means of conductor 14A. The base of transistor Q64 is connected to the bases of current mirror transistors Q1 and Q54. (Note that transistors Q64 and Q65 function as current mirror output transistors.) The other terminal of resistor R45 is connected to $V_{CC}$. A capacitor C2 is connected in parallel with resistor R45. The emitter of transistor Q60 is coupled by resistor R42 to $V_{CC}$. The base of transistor Q60 is connected by conductor 16B to the base and collector of transistor Q66, the emitter of which is coupled by resistor R47 to $V_{CC}$. The collector of transistor Q60 is connected by conductor 11A to the emitter of diamond buffer input transistor Q57 and the base of diamond buffer output transistor Q74. Similarly, the emitter of transistor Q63 is connected to $V_{EE}$ and its base and collector are connected to one terminal of resistor R46 and to the emitter of transistor Q65 and also to the collector of input transistor Q57 by means of conductor 14B. The base of transistor Q65 is connected to the bases of current mirror transistors Q2 and Q55. The other terminal of resistor R46 is connected to $V_{EE}$. A capacitor C3 is connected in parallel with resistor R46. (Capacitors C2 and C3 are used to reduce the effects of transient signal which can occur when output stage 9 is overdriven.) The emitter of transistor Q61 is coupled by resistor R44 to $V_{EE}$. The base of transistor Q61 is connected by conductor 16A to the base and collector of transistor Q67, the emitter of which is coupled by resistor R48 to $V_{EE}$. The collector of transistor Q61 is connected by conductor 11B to the emitter of diamond buffer input transistor Q55 and the base of diamond buffer output transistor Q75.

The base and collector of current mirror input transistor Q66 are cross-coupled by conductor 16B to the collector of transistor Q65, and the base and collector of current mirror output transistor Q67 are cross-coupled by conductor 16A to the collector of transistor Q64.

Under quiescent conditions, the currents flowing in resistors R39, R45, R40, and R46 are all approximately equal to I. This amount of current will also flow in the collectors of PNP transistors Q54 and Q57 and in the collectors of NPN transistors Q55 and Q58. Since the current I flowing in resistor R46 is provided by the collector of PNP transistor Q57, NPN transistor Q65 will be substantially de-biased. Similarly, the current flowing in resistor R45 is provided by the collector of NPN transistor Q58 and PNP transistor Q64 will be substantially de-biased. Consequently, under quiescent conditions the collector currents of transistors Q64 and Q65 ideally are equal to 0. Consequently, the currents Ib will also be equal to 0 and the entirety of linear boost circuit 40 will be de-biased and therefore not contributing substantially to the quiescent current of output stage 9.

Figures 1, 5:
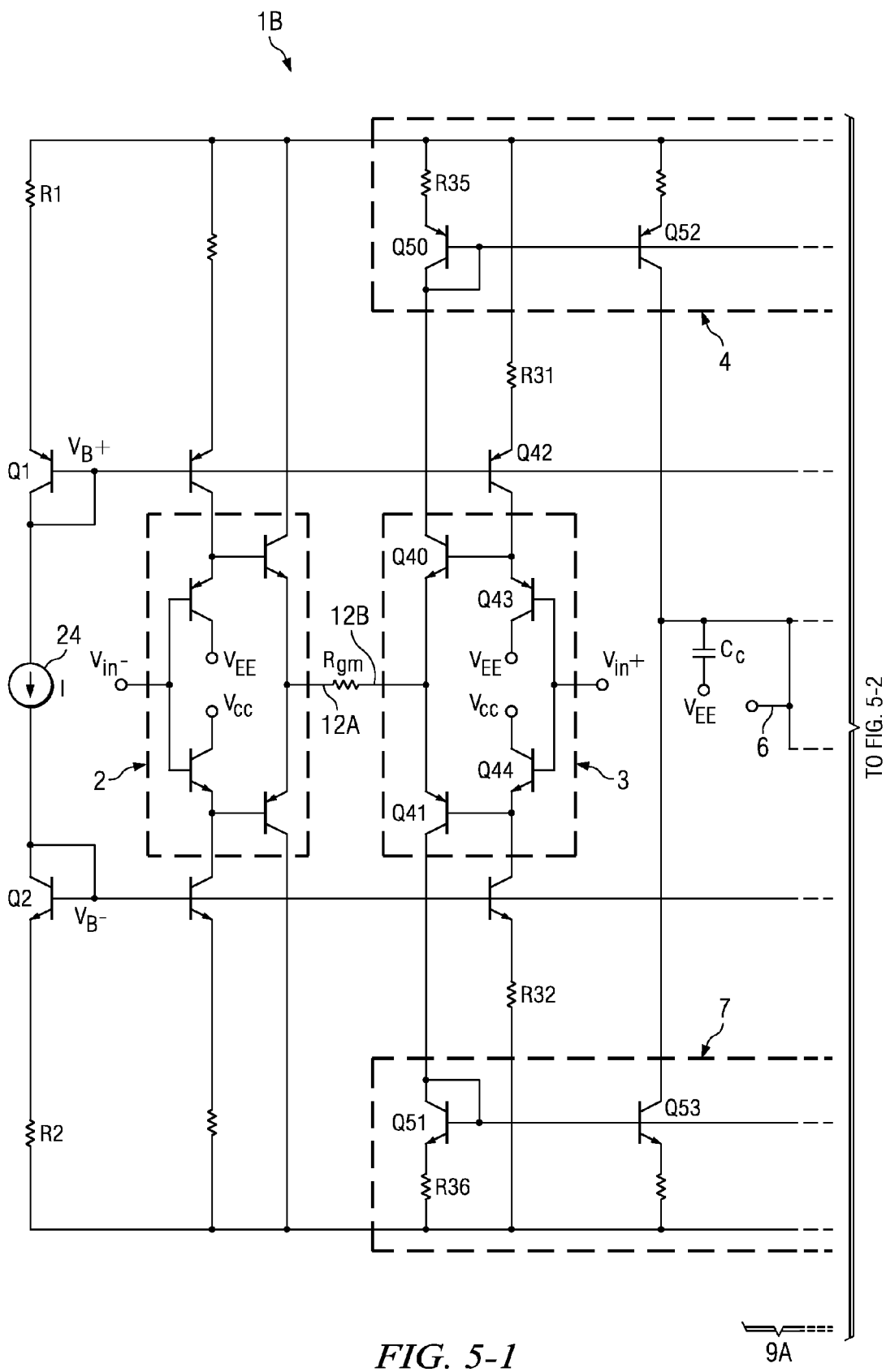
FIG. 5 is a detailed schematic diagram of a slew rate boosted voltage feedback operational amplifier including an output stage similar to the one shown in FIG. 4 and also including circuitry for dynamically biasing the output stage.
Figures 2, 5:
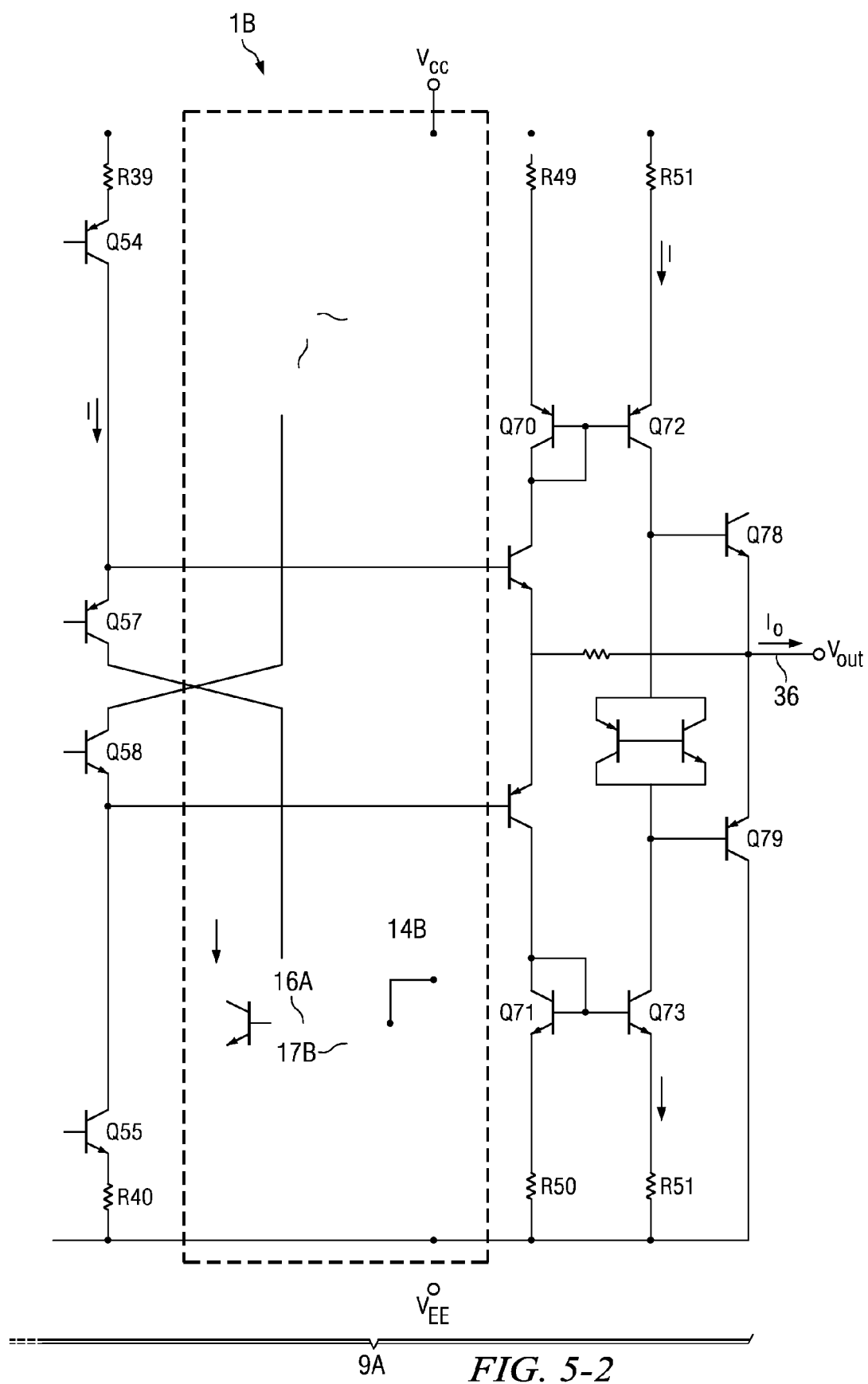

Without linear boost circuit 40, the basic topology of output stage 9 in FIG. 5 provides a $\beta^2$ current gain capability and has good stability when biased dynamically. Under quiescent conditions with the linear boost circuit 40, the current $I_n$ ideally will be equal to 2I and the current $I_b$ ideally will be equal to 0. Ideally, the current $I_b$ is capable of increasing to a maximum of I, so the current $I_n$ is able to increase to a maximum value of $\beta(2I)$. The equation for maximum output current is developed as follows:

$Io(\max) = \beta \times I_n(\max)$, $I_n(\max) = \beta \times (I + I_b(\max))$, $I_b(\max) \approx I$, so $Io(\max) \approx \beta \{\beta \times (I + I_b(\max))\} = \beta^2 \times 2I$.

Even though the above described prior art output stage 31 of FIG. 3 provides a $\beta^2$ current gain capability, it may be inadequate for providing both low quiescent current and high output current capability. In one example, the bias current for the input buffer made up of transistors Q57, Q58, Q74 and Q75 is only 27 µA. Using minimum transistor current gain β of 30, and calculating the ideal output current capability shows it to be about 24 mA under ideal conditions. However, due to finite β transistor current gain and Early voltage (transistor base width modulation voltage) parameters associated with bipolar junction transistors, the actual output current capability of prior art output stage 31 of FIG. 3 will be somewhat lower, and the output current will become non-linear at a much lower level, e.g. at a level lower than 20 mA. This falls short of a reasonable desired minimum output current specification of 25 mA.

To overcome the shortcomings of prior output stage 31 of FIG. 3, linear boost circuit 40 of FIG. 4 enables the bias current to the input diamond buffer to nearly double the amount of current that it supplies as more current is demanded by the base of either of transistors Q74 or Q75. Furthermore, linear boost circuit 40 supplies that current linearly.

During a load current demanding event, the base current to one of secondary output transistors Q74 or Q75 begins to increase. The increased base current flowing in either transistor Q74 or Q75 will result in a corresponding decrease in the collector current flowing in either transistor Q57 or Q58. In the absence of linear boost circuit 40, output stage 9 can no longer supply any additional output current when the base current of transistor Q74 or Q75 becomes equal to I. In accordance with the present invention, the decrease in collector current of either transistor Q57 or Q58 corresponding to the increase in base current of either transistor Q74 or Q75 is sensed and fed back to the bases of transistors Q74 and Q75. This can continue until the base current of transistor Q74 or Q75 has reached 2×I. This in effect doubles the amount of output current that output stage 9 is able to produce.

More specifically, transistors Q64 and Q65 sense the currents through transistors Q57 and Q58 by monitoring the resulting voltages across sense resistors R45 and R46. This causes a similar increase in the collector current of one of transistors Q64 or Q65 (which function both as source transistors and sense transistors). The increased collector current of Q64 or Q65 then is mirrored back by one of the current mirrors Q66,Q60 or Q67,Q61 to the base of whichever one of transistors Q74 or Q75 is "demanding" more base current. This process continues until the current supplied by transistor Q64 or Q65 has reached its maximum value.

In this example, transistors Q64 and Q65 are referenced with respect to the main bias current I, which can be set, for example, at a value of 27 µA. Thus, as stated earlier, the currents flowing in resistors R39, R45, R40, and R46 and the collectors of transistors Q58 and Q57 will all be approximately equal to 27 µA. However, due to the finite β and Early voltage parameters associated with bipolar junction transistors, the collector currents of transistors Q57 and Q58 may be somewhat less than 27 µA. Because of this, a substantial residual current can flow in sense transistors Q64 and Q65. This has the undesirable affect of causing the quiescent operating current of the amplifier to increase. To minimize the residual current flowing in sense transistors Q64 and Q65, the ratios between sense resistors R45 and R46 to reference resistors R1 and R2 are made greater than 1, more specifically, 1:1.6 in this example. Therefore, if the reference resistors R1 and R2 are set to 4 kilohms, sense resistors R45 and R46 are 6.5 kilohms. Because of this, the maximum output current from sense transistors Q64 and Q65 is less than the set value of 27 µA. In this example, the residual current is about 1.6 µA. Taking into account this increase and totaling its effect through the remainder of output stage 9 in FIG. 4, there is an increase in the total amount of quiescent current of approximately 4 μA. The payoff for using this small additional amount of quiescent current is an increase of more than 10 mA in the amount of linear output drive current that can be supplied by output stage 9. The ratio between the increase achieved in the a maximum amount of output current Io that can be supplied by output stage 9 to the increase in the amount of total quiescent current thereof is approximately 2500.

For large signal slew conditions, the circuit functions in the exact opposite manner; that is, it will tend to decrease its current. That is because during a slew condition, a surge current will be produced in one of the buffer pre-drive transistors (Q57 or Q58) as a result of charging the parasitic capacitance on its emitter. This current will flow in one of the sense resistors causing the source transistor to turn off hard. Indeed, it is not too difficult, during a slew condition, to produce several volts of drop across the 6.5 kilohm sense resistor. Although this only causes a minimum loss of slew current (1.6 μA) for the buffer pre-driver, it produces a large transient on the main bias lines and a large reverse bias across the emitter-base junction of the source transistor Q64 or Q65. To minimize this effect, the emitters of the source transistors Q64 and Q65 are clamped using diode-connected transistors Q62 and Q63.

Output stage 9 of FIG. 4 provides a linear, demand driven increase in base current to the output driver transistors of a diamond buffer and allows the output current drive capability of the output stage (or an operational amplifier including output stage 9) to be doubled while increasing the overall quiescent current of output stage 9 by less than 5%. Therefore, output stage 9 can substantially improve the output drive capability of any diamond-buffer-based stage with relatively little increase in the quiescent current thereof.

The basic function of the invention as shown in FIG. 4 is to provide a linear, demand driven increase in base current to the output drivers of a diamond buffer. It may therefore be useful in any diamond buffer based stage whether the diamond buffer forms a stand alone stage or it forms the pre driver to a composite buffer like the application described above.

The $\beta^2$ output stage 34 as shown in FIG. 4 tends to respond slowly to a fast positive-going or negative-going transition of its input signal, and has a tendency to become unstable under some conditions. A known technique for overcoming this tendency is to "dynamically bias" $\beta^2$ output stage 34. FIG. 5 shows a slew rate boosted voltage feedback operational amplifier of the kind generally shown in Prior Art 1 including an output stage of the present invention similar to the one shown in FIG. 4, further including circuitry for dynamically biasing the output stage.

Output stage 9A in FIG. 5 is essentially the same as output stage 9 in FIG. 4, except that in FIG. 5 conductors 11A and 11B are not connected to the bases of transistors Q1 and Q2, respectively. In FIG. 5, input buffers 2 and 3 (shown in Prior Art FIG. 1) are implemented by means of conventional diamond buffer circuits. The input of diamond buffer 2 receives Vin⁻, and its output is connected by conductor 12A to one terminal of transconductance resistor $R_{gm}$. As in FIG. 1, diamond buffer 2 in FIG. 5 is coupled between $V_{CC}$ and $V_{EE}$. The input of diamond buffer 3 receives Vin⁺, and its output is connected by conductor 12B to the other terminal of transconductance resistor $R_{gm}$. As in FIG. 1, diamond buffer 3 in FIG. 5 is coupled between current mirrors 4 and 7. Upper current mirror 4 includes diode-connected PNP current mirror input transistor Q50 having its emitter coupled by resistor R35 to $V_{CC}$ and its collector connected to the collector of the NPN input transistor Q40 of diamond buffer 3. The emitter of PNP current mirror output transistor Q54 has its emitter coupled by resistor R36 to $V_{CC}$ and its collector is connected to conductor 11A. Similarly, lower current mirror 7 includes diode-connected NPN current mirror input transistor Q51 having its emitter coupled by resistor R36 to $V_{EE}$ and its collector connected to the collector of the PNP input transistor Q41 of diamond buffer 3. The emitter of NPN current mirror output transistor Q55 is coupled to $V_{EE}$ by resistor R40, and its collector is connected to conductor 11B.

PNP current mirror output transistor Q52 of current mirror 4 and NPN current mirror output transistor Q53 of current mirror 7 have their collectors connected to conductor 6, which is the input of output stage 9A.

In FIG. 5, current mirror output transistors Q54 and Q55 are connected to, or actually, are a part of "signal" current mirrors 4 and 7, respectively. Consequently, the current I in transistor Q54 and the current in transistor Q52 which charges compensation capacitor Cc experience surges in response to a positive-going pulse of Vin⁺, and a negative-going pulse of Vin⁺ causes a surge of current through transistor Q55. Those two boosting effects substantially boost the drive currents to the bases of transistors Q74 and Q75 in response to fast positive-going and negative-going edges of Vin⁺, and therefore substantially improve the pulse response of output stage 9A and the operational amplifier 1B containing output stage 9A.

While the invention has been described with reference to several particular embodiments thereof, those skilled in the art will be able to make various modifications to the described embodiments of the invention without departing from its true spirit and scope. For example, the current mirror input to output current ratios of the linear boost circuit 40 can be greater than 1 to provide β2×nI current gain capability. It is intended that all elements or steps which are insubstantially different from those recited in the claims but perform substantially the same functions, respectively, in substantially the same way to achieve the same result as what is claimed are within the scope of the invention. For example, the linear boost circuit 10 of the present invention could also be used in conjunction with the prior art circuit shown in FIG. 3, in which case, the applicable equation for the maximum output current would be Io(max)=B×2I.

What is claimed is:

1. Output stage circuitry, comprising:
   (a) a diamond buffer including a PNP first input transistor, an NPN second input transistor, an NPN first output transistor, and a PNP second output transistor, an emitter of the first input transistor being coupled to a first conductor and receiving a first reference current having a first predetermined value, an emitter of the second input transistor being coupled to a second conductor and receiving a second reference current having the first predetermined value, bases of the first and second input transistors being coupled to an input conductor, bases of the first and second output transistors being coupled to the first and second conductors, respectively, emitters of the first and second output transistors being coupled to a first output conductor; and
   (b) a linear boost circuit including a first current mirror, a PNP first transistor having an emitter coupled to a first sensing resistor, a second current mirror, an NPN second transistor having an emitter coupled to a second sensing resistor, an input of the first current mirror being coupled to a collector of the second transistor, an output of the first current mirror being coupled to the first conductor, an input of the second current mirror being coupled to a collector of the first transistor, an output of the second current mirror being coupled to the second conductor to boost current in the first and second output transistors when they require base currents greater in magnitude than the first predetermined value.

2. The output stage circuitry of claim 1 including an output driver including a third current mirror having an input coupled to a collector of the first output transistor and an output coupled to a base of an NPN third output transistor, a fourth current mirror having an input coupled to a collector of the second output transistor and an output coupled to a base of a PNP fourth output transistor, emitters of the third and fourth output transistors being coupled by a second output conductor to one terminal of a feedback resistor having another terminal coupled to emitters of the first and second output transistors.

3. The output circuitry of claim 2 wherein the third output transistor and to the fourth are included in a class AB output stage.

4. The output circuitry of claim 3 wherein the class AB output stage includes a PNP third transistor having an emitter connected to the base of the third output transistor and to a collector of an NPN fourth transistor having a base connected a base of the third transistor, the third transistor having a collector connected to the base of the fourth output transistor and an emitter of the fourth transistor.

5. The output stage circuitry of claim 1 including a PNP current mirror input transistor having a base and collector coupled to a first terminal of a current source, a PNP current mirror output transistor having a collector coupled to the first output conductor to provide the first reference current and also coupled to a base of the first transistor, and also including an NPN current mirror input transistor having a base and collector coupled to a second terminal of the current source, an NPN current mirror output transistor having a collector coupled to the second output conductor to provide the second reference current and also coupled to a base of the second transistor.

6. The output stage circuitry of claim 5 wherein an emitter of the PNP current mirror input transistor is coupled to a first reference voltage by means of a first resistor which establishes the first reference current at the first predetermined value and an emitter of the NPN current mirror input transistor is coupled to a second reference voltage by means of a second resistor which establishes the second reference current at the first predetermined value.

7. The output stage circuitry of claim 6 wherein the first and a second sensing resistors have substantially higher resistances than the first and second resistors.

8. The output stage circuitry of claim 7 wherein the first and second resistors have a resistance of approximately 4 kilohms and the first and second sensing resistors have a resistance of approximately 6.5 kilohms.

9. The output stage circuitry of claim 1 including a first clamp transistor coupled across the first sensing resistor to prevent transient overvoltages thereon and a second clamp transistor coupled across the second sensing resistor to prevent transient overvoltages thereon.

10. The output stage circuitry of claim 9 including a first capacitor coupled across the first sensing resistor and a second capacitor coupled across the second sensing resistor to reduce effects of transient signals across the first and second sensing resistors, respectively.

11. The output stage circuitry of claim 1 including circuitry for dynamic biasing of the output stage circuitry, including a PNP current mirror output transistor and an NPN current mirror output transistor, wherein the first conductor is coupled to the PNP current mirror output transistor which is controlled in response to an input voltage applied to an input stage of an operational amplifier and the second conductor is coupled to the NPN current mirror output transistor which also is controlled in response to the input voltage applied to the input stage of the operational amplifier.

12. A method for increasing a maximum output current magnitude of a diamond buffer, the method comprising:
(a) sourcing a bias current of a first predetermined magnitude into an emitter of a PNP first input transistor of the diamond buffer and sinking a bias current of the first predetermined magnitude out of an emitter of an NPN second input transistor of the diamond buffer;
(b) sensing a decrease in a collector current of the first input transistor caused by a demand for increased base current by an NPN first output transistor of the diamond buffer;
(c) increasing a collector current in an NPN another transistor in response to the sensed decrease in the collector current of the first input transistor; and
(d) mirroring the increased collector current of the NPN another transistor into a base of the first output transistor to boost the base current thereof and maintain operation of the first input transistor without substantially increasing quiescent current of the diamond buffer when the amount of base current demanded by the first output transistor exceeds the first predetermined magnitude.

13. The method of claim 12 including:
(1) sensing a decrease in a collector current of the second input transistor caused by a demand for increased base current by a PNP second output transistor of the diamond buffer;
(2) increasing a collector current in a PNP another transistor in response to the sensed decrease in the collector current of the second input transistor; and
(3) mirroring the increased collector current of the PNP another transistor into a base of the second output transistor to boost the base current thereof and maintain operation of the second input transistor without substantially increasing quiescent current of the diamond buffer when the amount of base current demanded by the second output transistor exceeds the first predetermined magnitude.

14. Circuitry for increasing a maximum output current magnitude of a diamond buffer, comprising:
(a) means for sourcing a bias current of a first predetermined magnitude into an emitter of a PNP first input transistor of the diamond buffer and sinking a bias current of the first predetermined magnitude out of an emitter of an NPN second input transistor of the diamond buffer;
(b) means for sensing a decrease in a collector current of the first input transistor caused by a demand for increased base current by an NPN first output transistor of the diamond buffer;
(c) means for increasing a collector current in an NPN another transistor in response to the sensed decrease in the collector current of the first input transistor; and
(d) means for mirroring the increased collector current in the NPN another transistor into a base of the first output transistor to boost the base current thereof and maintain operation of the first input transistor when the amount of base current demanded by the first output transistor exceeds the first predetermined magnitude.

15. The circuitry of claim 14 including means for sensing a decrease in a collector current of the second input transistor caused by a demand for increased base current by a PNP second output transistor of the diamond buffer, and means for increasing a collector current in a PNP another transistor in response to the sensed decrease in the collector current of the second input transistor, and means for mirroring the increased collector current of the PNP another transistor into a base of the second output transistor to boost the base current thereof and maintain operation of the second input transistor without substantially increasing quiescent current of the diamond buffer when the amount of base current demanded by the second output transistor exceeds the first predetermined magnitude.

* * * * *